United States Patent
Sun et al.

(10) Patent No.: US 8,390,489 B2
(45) Date of Patent: Mar. 5, 2013

(54) DIGITAL BACKGROUND CALIBRATION IN PIPELINED ADCS

(75) Inventors: Nan Sun, Cambridge, MA (US); Donhee Ham, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 12/863,441

(22) PCT Filed: Jan. 21, 2009

(86) PCT No.: PCT/US2009/000420
§ 371 (c)(1),
(2), (4) Date: Nov. 15, 2010

(87) PCT Pub. No.: WO2009/091620
PCT Pub. Date: Jul. 23, 2009

(65) Prior Publication Data
US 2011/0043395 A1    Feb. 24, 2011

Related U.S. Application Data

(60) Provisional application No. 61/021,739, filed on Jan. 17, 2008.

(51) Int. Cl.
*H03M 1/10* (2006.01)
(52) U.S. Cl. .......................... 341/120; 341/155
(58) Field of Classification Search ................... 341/155, 341/118, 120, 161, 143, 172, 162
See application file for complete search history.

(56) References Cited

U.S. PATENT DOCUMENTS

| | | | | |
|---|---|---|---|---|
| 6,097,326 A * | 8/2000 | Opris et al. | | 341/161 |
| 6,137,431 A * | 10/2000 | Lee et al. | | 341/161 |
| 6,750,799 B1 * | 6/2004 | Opris | | 341/161 |
| 6,891,486 B1 * | 5/2005 | Pentakota et al. | | 341/120 |
| 7,289,054 B1 * | 10/2007 | Watanabe | | 341/156 |
| 7,786,910 B2 * | 8/2010 | Ali et al. | | 341/131 |
| 7,830,159 B1 * | 11/2010 | Lee | | 324/679 |

* cited by examiner

*Primary Examiner* — Peguy Jean Pierre
(74) *Attorney, Agent, or Firm* — Elizabeth Kim Patent Law Offices LLC

(57) ABSTRACT

Digital background calibration in a pipelined ADC is performed by extracting a capacitor mismatch value $\Delta$ that represents a mismatch between a sampling capacitor $C_1$ and a feedback capacitor $C_2$ in the pipelined ADC, and using $\Delta$ to correct the capacitor mismatch error. $\Delta$ is extracted by performing commutated feedback capacitor switching (CFCS) in a background correlation loop. The error caused by the capacitor mismatch is calibrated out by subtracting the error from a digital output $D_{out}$ of the pipelined ADC. Convergence speed may be accelerated and convergence accuracy may be increased during digital background calibration of pipelined ADCs, by using a higher order LPF. A bandwidth switching scheme may be implemented by the LPF, i.e. a larger bandwidth may be utilized during calibration start-up to increase convergence speed during start-up and a smaller bandwidth may be utilized during steady state to increase convergence accuracy during steady state.

20 Claims, 9 Drawing Sheets

DIGITAL BACKGROUND CALIBRATION IN PIPELINED ADCS

CROSS-REFERENCE TO RELATED APPLICATIONS

This application is based upon, and claims the benefit of priority under 35 U.S.C. §119(e) from U.S. Provisional Patent Application Ser. No. 61/021,739 (the "'739 provisional application"), filed Jan. 17, 2008, entitled "Digital Background Calibration in Pipelined ADCs." The contents of the '739 provisional application is incorporated herein by reference in its entirety as though fully set forth.

STATEMENT REGARDING FEDERALLY SPONSORED RESEARCH

This invention was made with government support under grant NSF/PHY 06-46094, awarded by the National Science Foundation. The government has certain rights in the invention.

BACKGROUND

A major consideration in the design of analog-to-digital converters (ADCs) is capacitor mismatch errors. Various calibration techniques to correct them have been developed in both analog and digital domains. Digital background calibration is one class of such techniques.

While a number of digital background calibration techniques are known or researched, there is a need for simpler, more effective, and more cost-efficient methods for calibrating out capacitor mismatch errors.

Correlation based digital background calibration is being widely studied as a means to mitigate component mismatch errors in pipelined ADCs. Currently, a pronounced drawback of the correlation-based digital background calibration is slow convergence. With reasonable calibration circuit cost, it typically takes several 10 T samples for the calibration to converge within 12-bit accuracy. A higher resolution requires even more samples.

There is a need for methods and systems that can accelerate convergence in correlation based digital background calibration, without sacrificing convergence accuracy.

SUMMARY

In one embodiment, digital background calibration in a pipelined ADC is performed by extracting a capacitor mismatch value $\Delta$ that represents the amount of capacitor mismatch in the pipelined ADC, and using the extracted value $\Delta$ to determine the error caused by the capacitor mismatch. In one embodiment, the capacitor mismatch value $\Delta$ is extracted by performing commutated feedback capacitor switching in a background correlation loop. The error caused by the capacitor mismatch is then calibrated out, by subtracting the error from a digital output $D_{out}$ of the pipelined ADC.

In one embodiment, convergence speed is accelerated and convergence accuracy is increased during digital background calibration of pipelined ADCs, by using a higher order LPF (low pass filter) with a bandwidth switching scheme that utilizes a larger bandwidth during calibration start-up and a smaller bandwidth during steady state to accelerate convergence speed and increase convergence accuracy during steady state.

BRIEF DESCRIPTION OF DRAWINGS

The drawing figures depict one or more implementations in accord with the present concepts, by way of example only, not by way of limitations. The drawings disclose illustrative embodiments. They do not set forth all embodiments. Other embodiments may be used in addition or instead. In the figures, like reference numerals refer to the same or similar elements.

DETAILED DESCRIPTION

I. CFCS Based Digital Background Calibration in Pipelined ADCS

In the present disclosure, CFCS (commutated feedback capacitor switching) is used in cooperation with correlation-based digital background calibration to extract capacitor mismatch information, which is then used to correct the mismatch errors. The approach described in the present disclosure adds minimal digital cost, yielding an architecture much simpler than many existing digital background calibration approaches. This all-digital technique requires minimal extra digital circuits, and is applicable to single-bit and multi-bit-per-stage architectures. Also, the digital background calibration systems and methods described in the present disclosure converge for any input amplitudes.

Figure 1:
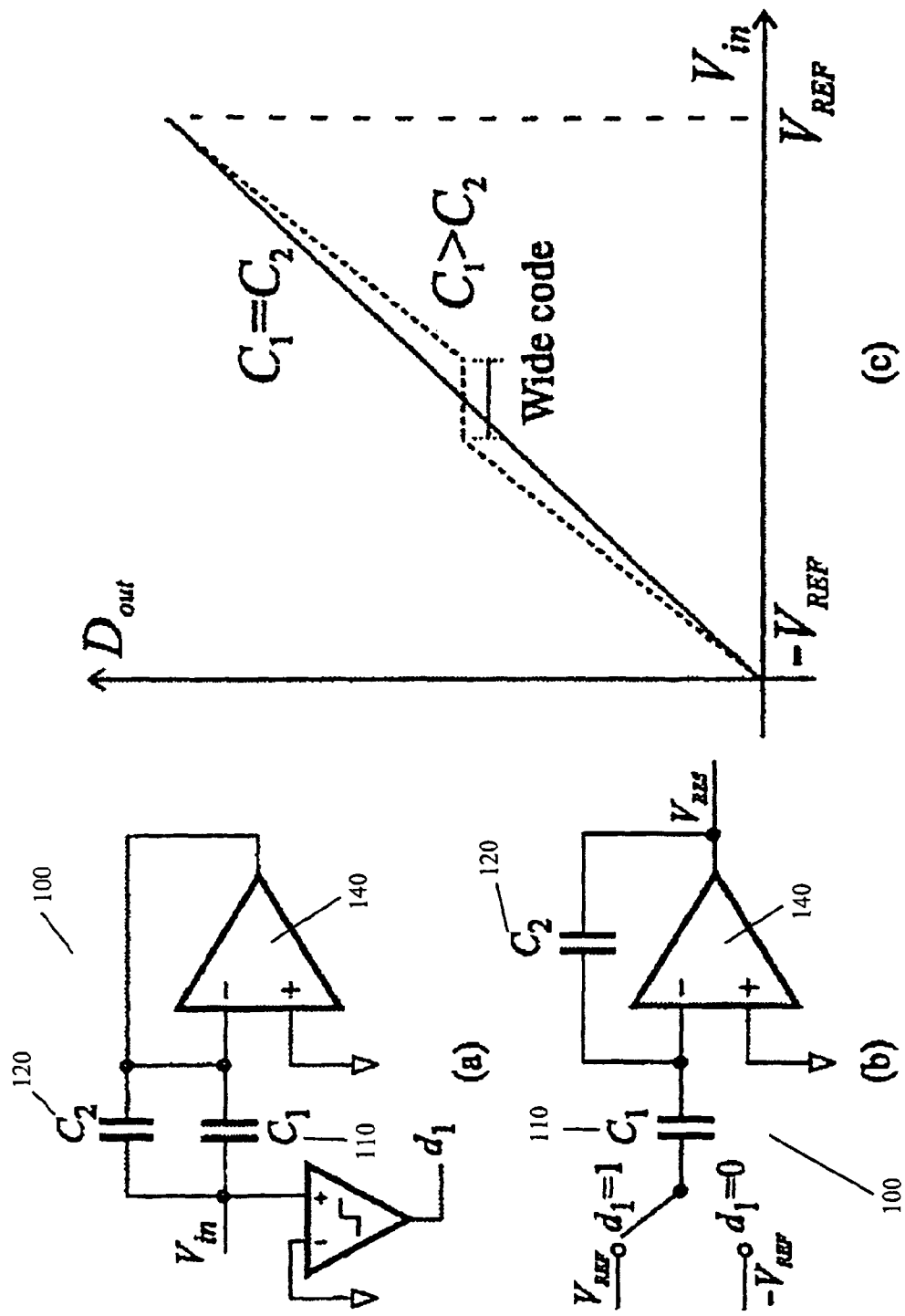
FIGS. 1(a) and 1(b) illustrate two different operational phases of the MSB (Most Significant Bit) stage of a 1-bit-per-stage pipelined ADC, namely the sampling phase (FIG. 1(a)) and the charge transfer phase (FIG. 1(b)).
FIG. 1(c) illustrates the ADC transfer curve for a 1-bit-per-stage pipelined ADC.

FIGS. 1(a) and (b) show two different operational phases of the most-significant-bit (MSB) stage, in a standard 1-bit-per-stage pipelined ADC 100. In one embodiment, capacitor mismatches may be assumed only in the most-significant-bit (MSB) stage, for simplicity. In the illustrated embodiment, the pipelined ADC includes two capacitors, $C_1$ (shown with reference numeral 110) and $C_2$ (shown with reference numeral 120), and a comparator 140. Ideally, $C_1$ and $C_2$ would be the same, but mismatches exist between them in reality. The mismatch between $C_1$ and $C_2$ may be represented with a parameter $\Delta$, defined as $\Delta \equiv (C_1/C_2)-1$.

In the sampling phase (illustrated in FIG. 1(a)), the ADC's input voltage $V_{in}$ sampled and held on $C_1$ and $C_2$ is compared to voltage zero to make decision on the MSB, $d_1$.

In the subsequent charge transfer phase (illustrated in FIG. 1(b)), $V_{REF}$ or $-V_{REF}$ will be connected to $C_1$ according to $d_1$, and the total charge will be redistributed between $C_1$ and $C_2$, resulting in the following residue voltage $V_{RES}$:

$$V_{RES} = \begin{cases} (2+\Delta)V_{in} + (1+\Delta)V_{REF} & [\text{for } d_1 = 0] \\ (2+\Delta)V_{in} - (1+\Delta)V_{REF} & [\text{for } d_1 = 1] \end{cases} \quad (1)$$

$V_{RES}$ is now an input to the following stage, which generates the second-significant bit, $d_2$. Repeating this procedure, $V_{in}$ is converted to a set of digitized bits, $\{d_1, d_2, d_3, \ldots d_N\}$, where N is the total number of stages in the pipelined ADC. This set of bits is the digital output of the ADC, or alternatively, the representation of the ADC's digital output can be thought of as:

$$D_{out} = -V_{REF} + 2V_{REF} \sum_{i=1}^{n} (d_i 2^{-i})$$

Using equation (1), $D_{out}$ can be related to $V_{in}$ via:

$$D_{out} = \begin{cases} (1+\Delta/2)V_{in} + (\Delta/2)V_{REF} & [\text{for } d_1 = 0] \\ (1+\Delta/2)V_{in} - (\Delta/2)V_{REF} & [\text{for } d_1 = 1] \end{cases} \quad (2)$$

In the above equation, quantization noise terms to highlight capacitor mismatch effects.

FIG. 1(c) is a plot of the ADC transfer curve, $D_{out}$ versus $V_{in}$, in accordance with equation (2). In the absence of capacitor mismatch ($\Delta=0$), the transfer curve is a straight line. Capacitor mismatch ($\Delta \neq 0$) creates a discontinuity in the transfer curve, shown as wide code in FIG. 1(c), causing differential nonlinearity (DNL).

Figure 2:
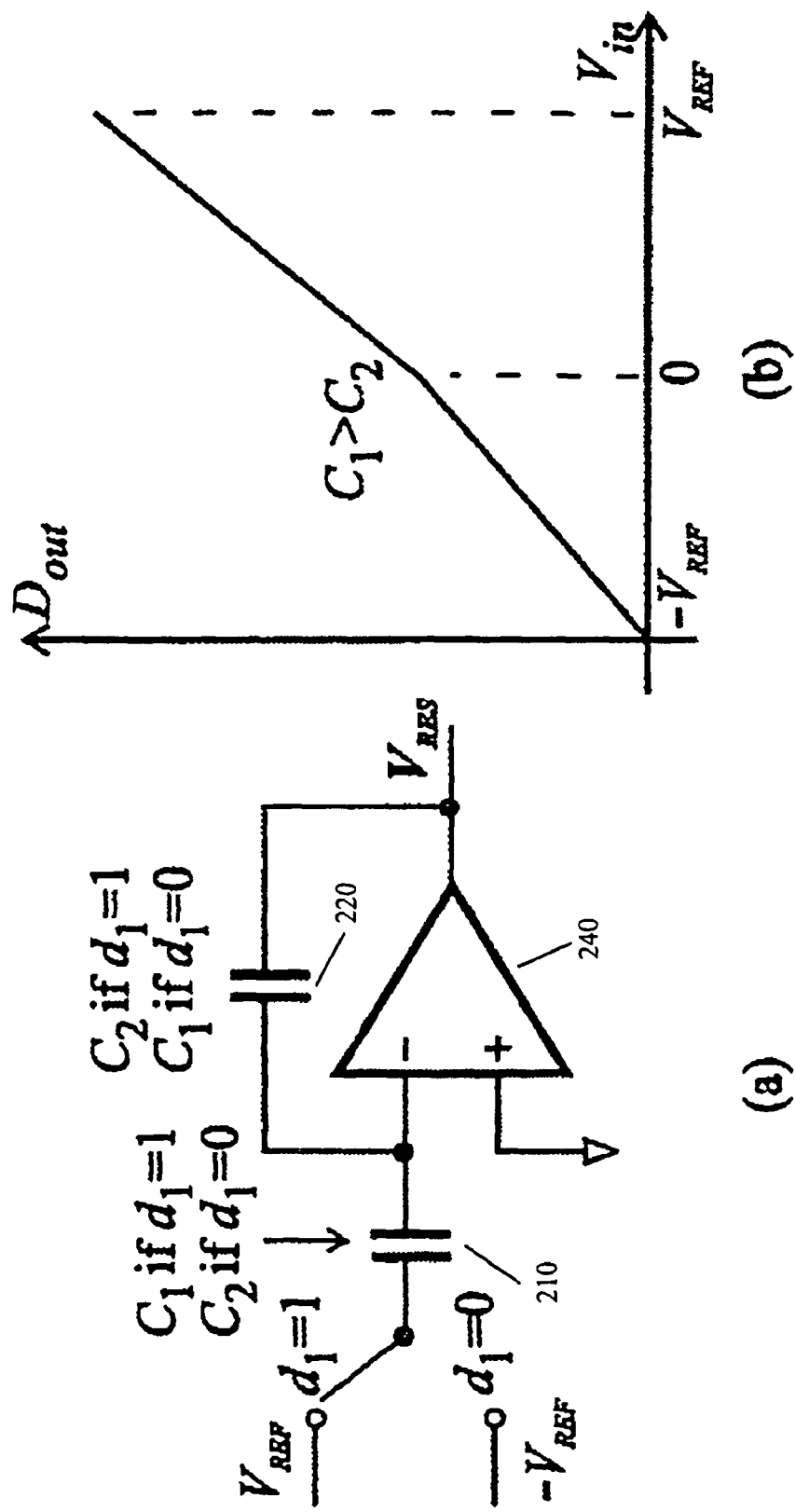
FIG. 2(a) illustrates CFCS (commutated feedback capacitor switching) applied during the charge transfer phase.
FIG. 2(b) is a plot of the ADC transfer curve, $D_{out}$ versus $V_{in}$.

To solve the DNL problem, it is known to apply commutated feedback capacitor switching (CFCS). FIGS. 2(a)-2(b) illustrate the applying of commutated feedback capacitor switching (CFCS) to remove DNL, in a pipelined ADC having a first capacitor $C_1$ (shown in with reference numeral 210), a second capacitor $C_2$ (shown with reference numeral 220), and a comparator 240. CFCS may be applied during the charge transfer phase, as shown in FIG. 2(a). If $d_1=0$, $C_1$ is selected as a feedback capacitor. If $d_1=1$, $C_2$ is selected as a feedback capacitor.

The essence of CFCS is the selection of the feedback capacitor in the charge transfer phase based on $d_1$ determined in the prior sampling phase. CFCS alters the expression for the residue voltage of the MSB stage from equation (1) above to the following:

$$V_{RES} = \begin{cases} (2-\Delta)V_{in} + (1-\Delta)V_{REF} & [\text{for } d_1 = 0] \\ (2+\Delta)V_{in} - (1+\Delta)V_{REF} & [\text{for } d_1 = 1] \end{cases} \quad (3)$$

Subsequently, the ADC output $D_{out}$ is related to $V_{in}$, via:

$$D_{out} = \begin{cases} (1-\Delta/2)V_{in} - (\Delta/2)V_{REF} & [\text{for } d_1 = 0] \\ (1+\Delta/2)V_{in} - (\Delta/2)V_{REF} & [\text{for } d_1 = 1] \end{cases} \quad (4)$$

$$= V_{in} + (\Delta/2)(|V_{in}| - V_{REF})$$

where in the simplification into the last line, the fact that $V_{in}>0$ for $d_1=1$ and $V_{in}<0$ for $d_1=0$ has been used.

FIG. 2(b) is a plot of the ADC transfer curve, $D_{out}$ versus $V_{in}$. As seen in FIG. 2(b), the discontinuity of the transfer curve has now disappeared, hence removing DNL.

In some embodiments of the present disclosure, CFCS is used for a different purpose, namely to extract the capacitor mismatch information, with the help of a background digital-correlation loop. The extracted mismatch information is subsequently used to calibrate out errors caused by the mismatch. This approach can improve ADC performance (including but not limited to resolution, and integral nonlinearity), beyond what can be achieved by removal of DNL only.

1-Bit-Per-Stage Case

A starting point for the extraction of capacitor mismatch information using CFCS, described in the present disclosure, may be the realization that there are two ways of executing CFCS in 1-bit-per-stage pipelined ADCs. The first way, described above, is to select $C_1$ as a feedback capacitor if $d_1=0$, and to select $C_2$ as a feedback capacitor if $d_1=1$. In the present disclosure, this specific CFCS execution (which led to equation (4) above) is hereinafter referred to as "CFCS-A" or "first CFCS mode." CFCS-A (or "first CFCS mode"), executed in a 1 bit-per-stage pipelined ADC, previously illustrated in FIG. 2(a), is re-illustrated in FIG. 3(a), which shows a pipelined ADC having a first capacitor $C_1$ (shown with reference numeral 310), a second capacitor $C_2$ (shown with reference numeral 320), and a comparator 340.

Figure 3:
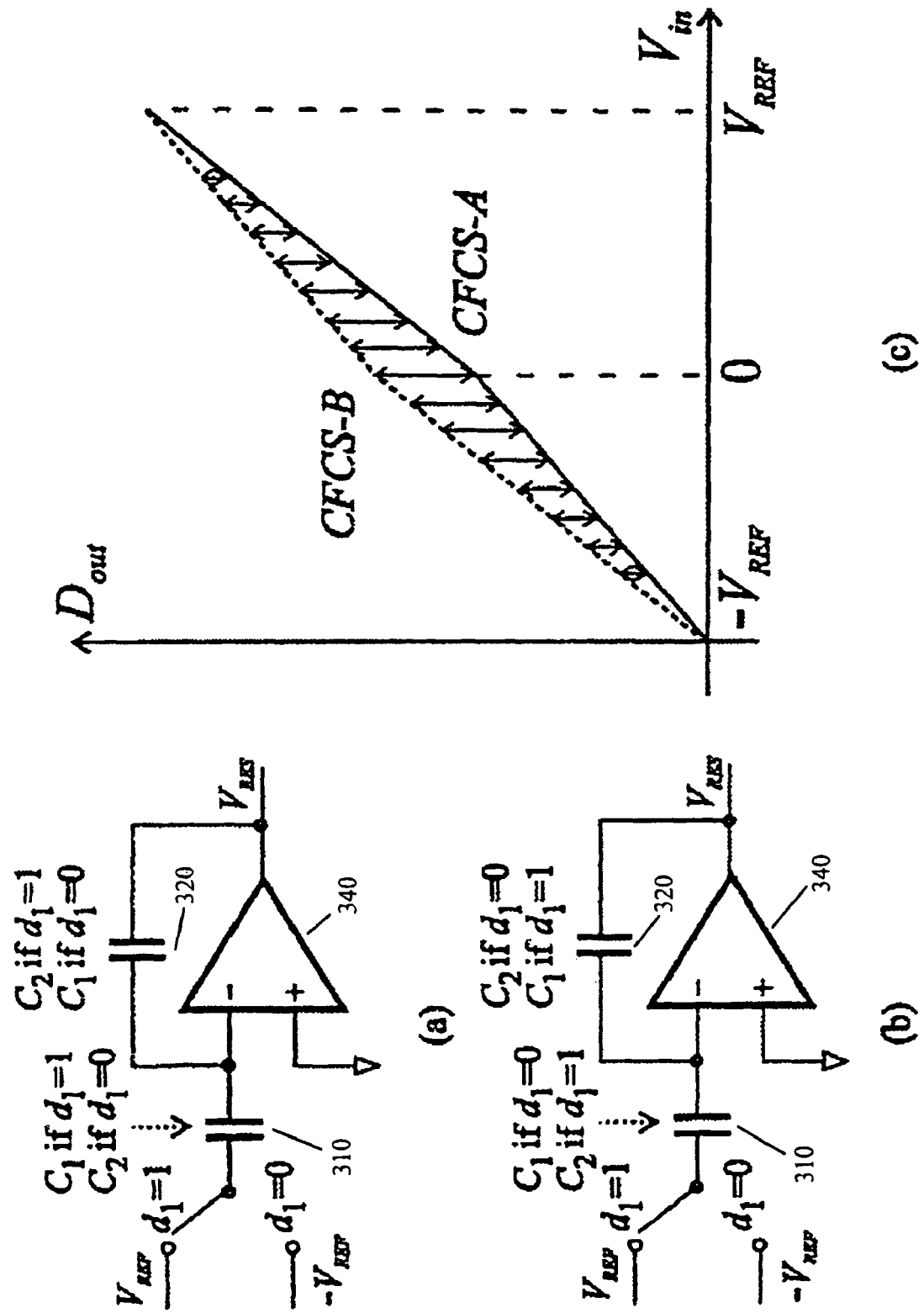
FIG. 3(a) illustrates a first mode of executing CFCS, CFCS-A, in a 1-bit-per-stage pipelined ADC.
FIG. 3(b) illustrates a second mode of executing CFCS, CFCS-B, in a 1-bit-per-stage pipelined ADC.
FIG. 3(c) illustrates the ADC transfer curves for CFCS-A and CFCS-B, for $\Delta>0$.

The other way is to select $C_2$ as a feedback capacitor for $d_1=0$ and to select $C_1$ as a feedback capacitor for $d_1=1$. In the present disclosure, this CFCS execution is referred to as "CFCS-B" or "second CFCS mode." and is illustrated in FIG. 3(b). FIG. 3(b) illustrates the second CFCS mode, or CFCS-B, in a 1-bit-per-stage pipelined ADC.

For CFCS-B, $V_{RES}$ is given by:

$$V_{RES} = \begin{cases} (2+\Delta)V_{in} + (1+\Delta)V_{REF} & [\text{for } d_1 = 0] \\ (2-\Delta)V_{in} - (1-\Delta)V_{REF} & [\text{for } d_1 = 1] \end{cases} \quad (5)$$

and accordingly, $D_{out}$ is related to $V_{in}$ via:

$$D_{out} = V_{in} - (\Delta/2)(|V_{in}| - V_{REF}) \quad (6).$$

FIG. 3(c) illustrates the ADC transfer curves for CFCS-A and CFCS-B, for $\Delta>0$. As seen in FIG. 3(c), and evident from equations (4) and (6) above, CFCS-A and CFCS-B lead to different ADC transfer characteristics. For the same analog input $V_{in}$, the digital output $D_{out}$ of CFCS-A is always smaller than CFCS-B for $\Delta>0$, and vice versa for $\Delta<0$. The distance between the two transfer curves is proportional to $\Delta$, as can be seen by subtracting (4) from (6):

$$D_{out,A} - D_{out,B} = \Delta \cdot (|V_{in}| - V_{REFs}) \quad (7),$$

where in equation (7) above, subscripts A and B indicate use of CFCS-A and CFCS-B, respectively.

Δ may be expressed as:

$$\Delta \approx \frac{D_{out,A} - D_{out,B}}{|D_{out,A}| - V_{REF}} \quad (8)$$

In going from equation (7) to equation (8), $|V_{in}|$ was approximated with $|D_{out,A}|$ to express Δ in terms of digital quantities that are known at the ADC output. Alternatively, $|V_{in}|$ may be replaced with $|D_{out,B}|$. The difference between $|D_{out,A}|$ and $|D_{out,B}|$ in the denominator adds only a second-order effect in the expression of Δ.

Equation (8) shows that by measuring the distance $D_{out,A} - D_{out,B}$ between the transfer curves for CFCS-A and CFCS-B for any input $V_{in}$, the capacitor mismatch information Δ can in principle be extracted.

In practice, $D_{out,A}$ and $D_{out,B}$ cannot be obtained simultaneously, for a given input $V_{in}$. This may be done if there were two identical ADCs, and operated one with CFCS-A and the other with CFCS-B, but such an arrangement is not possible. Therefore, extraction of Δ directly using (8) is not practically feasible. Instead, a time-averaged version of (7) or (8) may be obtained to extract Δ. This may be done in a given ADC first by randomly choosing one CFCS mode between CFCS-A or CFCS-B with equal probability for each input sample, then by creating a data sequence consisting of the resulting ADC outputs but with each output multiplied by 1 if CFCS-A was used and by −1 if CFCS-B was used, and then by time-averaging (i.e. low-pass filtering) the data sequence. This procedure to extract Δ can be executed by a correlation-based digital background calibration loop shown in FIG. 4.

Figure 4:
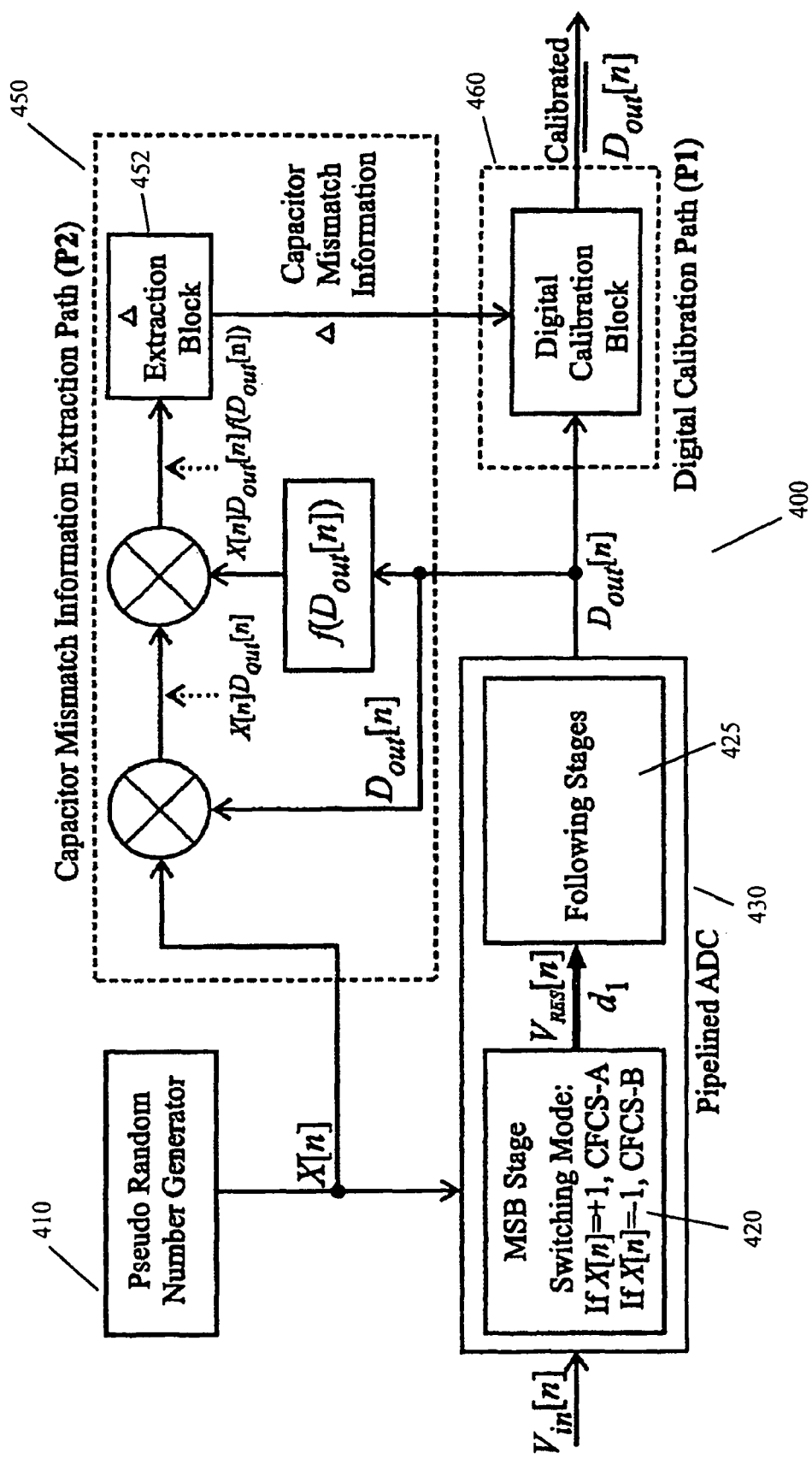
FIG. 4 illustrates an architecture and discrete-time signal processing for a digital background calibration in accordance with one embodiment of the present disclosure.

FIG. 4 illustrates an architecture and discrete-time signal processing for a digital background calibration, i.e. illustrates a system 400 for background calibration of a pipelined ADC in accordance with one embodiment of the present disclosure. Again for simplicity, in the embodiment illustrated in FIG. 4 capacitor mismatches are assumed only in the MSB stage, and hence in FIG. 4 the calibration is performed only in the MSB stage. In other embodiments of the present disclosure, capacitor mismatches may be assumed in stages other than the MSB stage, and the techniques described below may also be used to calibrate capacitor mismatch errors in stages other than the MSB stage.

In overview, the system 400 may include a pseudo-random number generator 410 configured to generate a pseudo-random variable X[n], where n is the number of input samples to the ADC; an analog-to-digital conversion module 430 configured to generate a pre-calibration ADC output $D_{out}[n]$ from an analog input voltage $V_{in}$ of the pipelined ADC; a Δ extraction module 450 configured to process the variable X[n] and the output $D_{out}[n]$ to extract the value Δ of the mismatch between $C_1$ and $C_2$, the Δextraction module including a discrete-time infinite impulse response low-pass filter (IIR LPF) 452 configured to output a DC average of X[n] $D_{out}[n]$; and a digital calibration module 460 configured to receive as input the capacitor mismatch value Δ and the pre-calibration output $D_{out}[n]$, and to calibrate the output $D_{out}[n]$ by subtracting therefrom the error caused by the capacitor mismatch value Δ.

Switching between CFCS-A and CFCS-B in the MSB stage is controlled by a pseudo-random variable X[n], which in the illustrated embodiment assumes +1 and −1 with equal probability. When X[n]=1, CFCS-A is executed, and ADC output $D_{out,A}$ of equation (4) results; when X[n]=−1, the MSB stage executes CFCS-B, yielding ADC output $D_{out,B}$ of (6).

Equations (4) and (6) may actually be combined into one equation, noting X[n]=1 for CFCS-A and X[n]=−1 for CFCS-B:

$$D_{out}[n] = V_{in}[n] + X[n] \cdot (\Delta/2)(|V_{in}[n]| - V_{REF}) \quad (9).$$

The above pre-calibration ADC output with the error term, X[n] (Δ/2)($|V_{in}[n]| - V_{REF}$), regarding which the goal is to calibrate out eventually, may now be separated into calibration path P1 and capacitor mismatch information extraction path P2, both of which are shown in FIG. 4.

Focusing on P2, $D_{out}[n]$ is first multiplied by X[n], subsequently multiplied by a certain function of $D_{out}[n]$, f($D_{out}[n]$), and then goes through a Δ-extraction block. For 1-bit-per-stage pipelined ADCs, f($D_{out}[n]$)=1 is used. This signal processing yields the following signal at the input of the Δ-extraction block of FIG. 4:

$$X[n]D_{out}[n] = X[n]V_{in}[n] + \frac{\Delta}{2}(|V_{in}[n]| - V_{REF}). \quad (10)$$

The Δ-extraction block is a discrete-time infinite impulse response low pass filter (IIR LPF) 452, and outputs a DC average of the input signal in equation (10). Since X[n] is a pseudo-random signal taking ±1 and is not correlated to $V_{in}[n]$, the DC average of the first term of equation (10) is zero. In contrast, the second term of (10) is always positive or negative, for $|V_{in}[n]| \leq V_{REF}$, and has a non-zero DC component. Therefore, at the output of the Δ extraction block (IIR LPF) one attains:

$$\overline{X[n]D_{out}[n]} = \frac{\Delta}{2}(\overline{|V_{in}[n]|} - V_{REF}). \quad (11)$$

In equation (11) above, and elsewhere in the present disclosure, the overline signifies DC averaging. Equation (11) is a time-averaged version of equation (7). From equation (11), Δ may be expressed as:

$$\frac{\Delta}{2} \approx \frac{\overline{X[n]D_{out}[n]}}{\overline{|D_{out}[n]|} - V_{REF}} \quad (12)$$

where $\overline{|V_{in}[n]|}$ was approximated with $\overline{|D_{out}[n]|}$, in going from equation (11) to equation (12), to express Δ in terms of what is explicitly known. The difference between $\overline{|V_{in}[n]|}$ and $\overline{|D_{out}[n]|}$ in the denominator on the right hand side produces only a second-order effect in the Δ expression. The numerator on the right hand side of (12) is what is measured (hence known) at the output of the Δ-extraction block. Equation (12) is the time-averaged version of equation (8).

The procedure outlined above, with the final result shown in equation (12), describes how a background correlation loop in conjunction with CFCS can extract the Δ information.

Once Δ is determined, it can be used it to calibrate out the error term in the pre-calibration ADC output $D_{out}[n]$ of equation (9) in a straightforward fashion, using a digital calibration block 460 in path P1 shown in FIG. 4.

The basic operation performed by the digital calibration block 460 is:

$$\overline{D_{out}[n]} = D_{out}[n] - X[n] \cdot (\Delta/2)(|D_{out}[n]| - V_{REF}) \quad (13)$$

$$\approx V_{in}[n]$$

In equation (13) above, what is subtracted from $D_{out}[n]$ in the first line is what is now known. In going to the second line using equation (9) for $D_{out}[n]$, second-order effects were omitted. $\overline{D_{out}}$ represents the corrected digital output, as can be seen from FIG. 4.

1.5-Bit-Per-Stage Case

Figure 5:
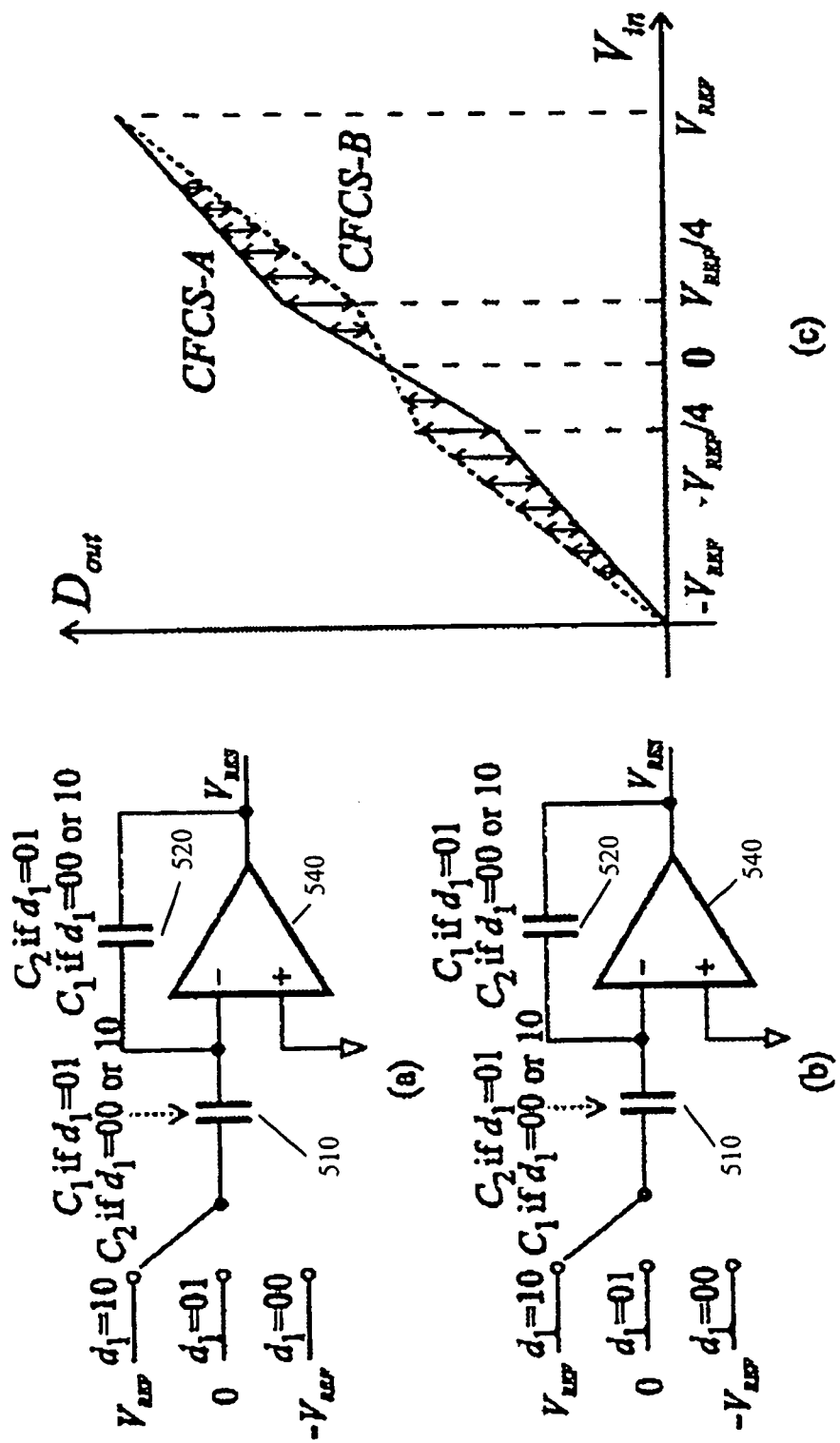
FIG. 5(a) illustrates CFCS-A for a 1.5-bit-per-stage case.
FIG. 5(b) illustrates CFCS-B for a 1.5-bit-per-stage case.
FIG. 5(c) illustrates transfer curves for CFCS-A and CFCS-B for $\Delta>0$.

FIG. 5(a) illustrates CFCS-A for a 1.5-bit-per-stage case, while FIG. 5(b) illustrates CFCS-B for a 1.5-bit-per-stage case, and FIG. 5(c) illustrates transfer curves for CFCS-A and CFCS-B for $\Delta>0$.

In the 1.5-bit-per-stage case, illustrated in FIG. 5(a)-5(c), capacitor mismatches are also assumed only in the MSB stage. Again, the MSB stage's digital decision is denoted again as $d_1$, which now assumes one of 00, 01, and 10. As shown in FIGS. 5(a) and 5(b), there are two capacitors $C_1$ (shown with reference numeral 510) and $C_2$ (shown with reference numeral 520) in the MSB stage (and any other stage), whose mismatch is again represented by $\Delta \equiv C_1/C_2 - 1$. The comparator is shown with reference numeral 540 in FIGS. 5(a) and 5(b).

The starting point, as in the 1-bit-per-stage case, is realizing that there are two different ways of executing CFCS. One way (CFCS-A or first CFCS mode) is to select $C_1$ as a feedback capacitor when $d_1=01$ and to select $C_2$ as a feedback capacitor when $d_1=00$ or 10, as shown in FIG. 5(a). The other way (CFCS-B or second CFCS mode) is to select $C_2$ as a feedback capacitor when $d_1=01$ and to select $C_1$ as a feedback capacitor when $d_1=00$ or 10, as shown in FIG. 5(b).

As in the 1-bit-per-stage case, it can be shown that CFCS-A and CFCS-B result in two different overall transfer curves, as shown in FIG. 5(c), and that the distance between the two transfer curves is proportional to $\Delta$. Just as in the 1-bit-per-stage case, $\Delta$ is now extracted by measuring the distance using the architecture shown in FIG. 4.

Unlike the 1-bit-per-stage case, however, where the transfer curve for CFCS-A is always below that for CFCS-B (see FIG. 3(c); $\Delta>0$), the two transfer curves for CFCS-A and CFCS-B in the 1.5-bit-per-stage case have a crossover at $V_{in}=D_{out}=0$ and $D_{out,A}[n]>D_{out,B}[n]$ for $V_{in}[n]>0$ but $D_{out,A}[n]<D_{out,B}[n]$ for $V_{in}[n]<0$, as shown in FIG. 5(c).

Therefore, if $f(D_{out}[n])=1$ is used as in the 1-bit-per-stage case, the resultant signal $X[n] D_{out}[n]$ ($X[n]=1$ for CFCS-A; $X[n]=-1$ for CFCS-B) at the input of the $\Delta$-extraction block of FIG. 4 will be time-averaged to zero at the output of the $\Delta$-extraction block, no matter what the value of $\Delta$ is. Therefore with $f(D_{out}[n])=1$, $\Delta$ cannot be extracted.

This problem may be solved by using $f(D_{out}[n])$ specifically defined, for the 1.5-bit-per-stage case, as the following:

$$f(D_{out}[n]) = \begin{cases} +1 & \text{if } D_{out}[n] \leq 0 \\ -1 & \text{if } D_{out}[n] > 0 \end{cases} \quad (14)$$

With this $f(D_{out}[n])$, $D_{out}[n] f(D_{out}[n])$ of CFCS-A will be always smaller than that of CFCS-B for any given $V_{in}[n]$, and hence the input to the $\Delta$-extraction block in FIG. 4, namely $X[n] D_{out}[n] f(D_{out}[n])$, will be time-averaged to a non-zero value that is proportional to $\Delta$. This shows the utility of $f(D_{out}[n])$, which was less evident in the 1-bit-per-stage case.

Multi-Bit-Per-Stage Case

The background calibration technique described above can be easily generalized from 1-bit-per-stage and 1.5-bit-per-stage cases to m-bit-per-stage or (m+0.5)-bit-per-stage cases (m=1, 2, 3, ...). In practice, typical values for m are 1, 2, and 3.

In each stage, there are a total of $2^m$ capacitors, and again, capacitor mismatches are assumed only in the MSB stage for simplicity. The capacitors in the MSB stage are denoted as $C_1$, $C_2$, $C_3$, ... $C_{2^m}$ and the capacitor mismatch between $C_k$ and $C_{k+1}$ is represented as $\Delta_k \equiv (C_{k+1}/C_k)-1$, where k=1, 2, 3, ..., ($2^m-1$). Once every $\Delta_k$ is extracted, errors brought by all mismatches can be calibrated out.

In one embodiment, the procedure described in conjunction with FIG. 4 may be used to extract $\Delta_k$. Two CFCS execution modes are first defined, which are referred to as CFCS-$A_k$ (or first CFCS mode) and CFCS-$B_k$ (or second CFCS mode). In CFCS-$A_k$, $C_k$ is selected as a feedback capacitor if $d_1$ is even, and $C_{k+1}$ is selected as a feedback capacitor if $d_1$ is odd. In CFCS-$B_k$, we select $C_{k+1}$ as a feedback capacitor if $d_1$ is odd, and $C_k$ is selected as a feedback capacitor if $d_1$ is even.

The function $f(D_{out})$ is set at 1 at $D_{out}=V_{in}=-V_{REF}$ and continues to be 1 with increasing $V_{in}$, until there is a crossover between the transfer curves of CFCS-$A_k$ and CFCS-$B_k$. At the crossover, $f(D_{out}[n])$ becomes $-1$ and remains to be $-1$ until the next crossover. This procedure is repeated, to completely determine $f(D_{out}[n])$. This ensures that $D_{out}[n] f(D_{out}[n])$ of CFCS-$A_k$ is always smaller than CFCS-$B_k$ for $\Delta_k > 0$, and always larger than CFCS-$B_k$ for ($\Delta_k < 0$). From the output of the $\Delta$-extraction block proportional to $\Delta_k$, $\Delta_k$ is extracted.

In one embodiment, the overall calibration algorithm can be summed up as follows, for each input sample (for each time index n):

1) Select k and decide which $\Delta_k$ is to be extracted, using a pseudo-random signal $X_{cap}[n]=1, 2, 3 \ldots, (2^m-1)$ (equal probability).

2) Select which CFCS mode to use between CFCS-$A_k$ and CFCS-$B_k$, according to another pseudo-random signal $X_{mode}[n]=\pm 1$ (equal probability).

3) Let $X_{mode}[n] D_{out}[n] f(D_{out}[n])$ go through the $k^{th}$ LPF. From the output, $\Delta_k$ is extracted.

4) Perform digital calibration according to $\Delta_k$, obtained in step 3).

In sum, digital background calibration methods and systems have been described in which CFCS is used in conjunction with background correlation. The approach described in the present disclosure easily lends itself to the capacitor mismatch information extraction, and leads to a very simple digital background calibration architecture, shown in FIG. 4, where the pipelined ADC is the only analog block. The cost of implementing the above-described techniques is low. Since $X[n]=\pm 1$ and $f(D_{out}[n])=\pm 1$, the two multipliers can be implemented by simple combinational logics instead of general multipliers. Overall, only shift registers, standard discrete-time LPF, and simple combinational logics are needed in the calibration loop. The architecture is much simpler than many existing digital background calibration architectures. In contrast to other background calibration techniques known in the art, the convergence of the techniques described above is ensured for any given input, with no limit on input amplitude.

II. Digital Acceleration of Correlation-Based Digital Background Calibration in Pipelined ADCs In section II of the present disclosure, a general digital technique is described for accelerating convergence of correlation-based digital background calibration in pipelined ADCs, implemented in some embodiments. Based on a frequency domain analysis, the component mismatch information extraction process (a central procedure in any correlation-based background calibration) is first viewed as discrete-time low-pass filtering. This leads to a design of a higher-order discrete-time loss-pass filter with a bandwidth switching scheme to rapidly extract mismatch information. Simulations show that overall, the technique described below increases convergence speed by about 18 times or so, in simulations, while adding minimal digital cost.

A central procedure common among all correlation-based digital background calibrations is the extraction of component mismatch information from correlated data sequences. This extraction process determines convergence time.

A starting point in the simple fast-convergence solution implemented in one embodiment of the present disclosure is the realization that the extraction procedure is equivalent to discrete-time infinite impulse response (IIR) low-pass filtering. This notion may be attained by examining general correlation-based calibrations in frequency domain, and showing the equivalence of a widely-used iterative extraction algorithm to the $1^{st}$-order discrete-time IIR low-pass filter (LPF). In this way, the convergence problem may be transformed into a filter design problem.

In overview, a first component of the fast convergence solution set forth in the present disclosure is the use of a higher-order IIR LPF, instead of the widely-used iterative extraction, which can be shown to be equivalent to the $1^{st}$-order IIR LPF, thereby accelerating convergence. A second component is the use of a bandwidth switching scheme in the IIR LPF to further accelerate convergence. These two arrangements in the digital filter for fast convergence may be implemented with minimal added digital cost.

Figure 6:
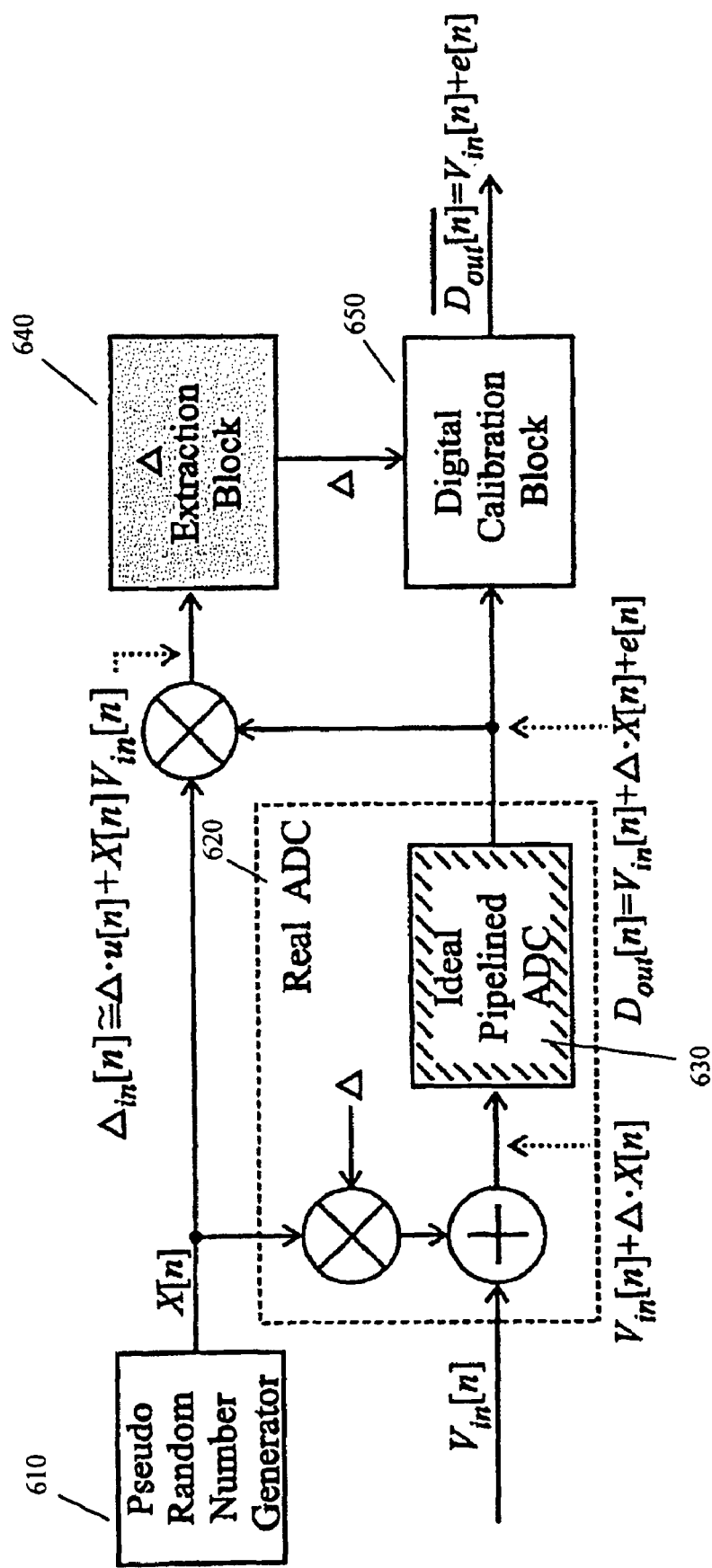
FIG. 6 is a schematic block diagram of a general correlation based digital background correlation.

A frequency-domain picture of the general correlation-based digital background calibration is described below. FIG. 6 is a schematic block diagram that illustrates an abstract model of a general correlation-based digital background calibration of capacitor mismatch errors in pipelined ADCs. In FIG. 6, the real ADC 620 is separated into an ideal ADC 630 with no capacitor mismatch, plus the explicit capacitor mismatch information, $\Delta$. To understand $\Delta$ concretely, the example of typical 1-bit or 1.5-bit-per-stage pipelined ADCs may be considered. In any given stage, the mismatch between a sampling capacitor $C_1$ and a feedback capacitor $C_2$ may be represented by $\Delta \equiv |C_1/C_2 - 1|$, and the model of FIG. 6 may be thought of as being applied to each stage. Alternatively, $\Delta$ may be thought of as what collectively represents the overall capacitor mismatch.

In the embodiment illustrated in FIG. 6, the calibration procedure is as follows. First, the capacitor mismatch $\Delta$ is correlated with a causal pseudo-random signal $X[n]$ (+1 or -1 with equal probability for $n \geq 0$; 0 for $n < 0$), generated by a pseudo random number generator 610. This correlation is added to the real ADC input, $V_{in}[n]$. This sum is passed through the ideal ADC 630. As described previously, the pre-calibrated digital output of the ADC is denoted as $D_{out}[n]$. As noted in FIG. 6, $D_{out}[n] = V_{in}[n] + X[n]\Delta + e[n]$, where $e[n]$ is quantization noise. $D_{out}[n]$ is correlated with the same digital pseudo-random signal $X[n]$. Since $X^2[n] = u[n]$, where $u[n]$ is the unit-step function, $\Delta \cdot u[n] + X[n]V_{in}[n] + X[n]e[n]$ is attained, as the outcome of the second correlation. This signal (outcome of the second correction) will henceforth be denoted as $\Delta_{in}[n]$:

$$\Delta_{in}[n] \equiv \Delta \cdot u[n] + X[n]V_{in}[n] + X[n]e[n] \quad (15)$$

$$\cong \Delta \cdot u[n] + X[n]V_{in}[n]$$

In the above equation, $X[n]e[n]$ has been neglected, assuming high-resolution applications (>10 bits), in which $V_{in}[n] \gg e[n]$. $\Delta_{in}[n]$ bears the capacitor mismatch information, $\Delta$, which however is obscured by the additive term, $X[n]V_{in}[n]$. A key step of this entire procedure is to extract $\Delta$ from $\Delta_{in}[n]$, by effectively removing the additive term, using a $\Delta$ extraction block. Once $\Delta$ is attained, it can be used in a standard digital calibration block 650 to calibrate out capacitor mismatch errors from $D_{out}[n]$, yielding the desired digital output, $\overline{D_{out}[n]} = V_{in}[n] + e[n]$.

In the above model, extracting $\Delta$ within a given accuracy from $\Delta_{in}[n]$ of (15) requires a certain number of samples (the index 'n' runs over a certain set of integers), which defines the convergence time. The convergence time depends crucially on the specific extraction algorithm used. In the past, iterative methods have been used. In the present disclosure, a different method is proposed which is the key to a simple and fast convergence solution implemented in some embodiments of the present disclosure.

The difference between the iterative algorithm, and the fast-convergence algorithm described in the present application, is now explained. A frequency domain picture of $\Delta_{in}[n]$ in equation (15) is first obtained, as set forth below.

The Fourier transform of the first term of equation (15), $\Delta \cdot u[n]$, is:

$$\mathcal{F}\{\Delta \cdot u[n]\} = \Delta\left(\frac{1}{1-e^{j\omega}} + \sum_{k=-\infty}^{\infty} \pi\delta(\omega + 2\pi k)\right) \quad (16)$$

As for the second term $X[n]V_{in}[n] \equiv Y[n]$ of equation (15), since it is a random process, a Fourier transform is not directly taken, but rather its power spectral density (PSD) is calculated, and its frequency domain representation is obtained by taking the square root of the PSD. To this end, the autocorrelation functions of $X[n]$, $V_{in}[n]$ and $Y[n]$ are denoted as $R_{XX}[m]$, $R_{VV}[m]$, and $R_{YY}[m]$, respectively. Since $X[n]$ and $V_{in}[n]$ are independent random processes, $R_{YY}[m] = R_{XX}[m] \cdot R_{VV}[m]$.

Suppose $X[n]$ is a pseudo-random signal with period T: after time T, the same pattern of $X[n]$ is repeated. If T is large enough, $R_{XX}[m]$ may modeled as:

$$R_{XX}[m] = E[X[n] \cdot X[n+m]] \quad (17)$$

$$\cong \frac{1}{2}\sum_{n=-\infty}^{\infty} \delta[m-nT].$$

In the above equation, $\delta[n]$ is the discrete-time delta function. This model is approximately valid, as the correlation of two pseudo-random sequences $X[n]$ and $X[n+m]$ is approximately zero (the approximate nature originates from the "pseudo"-randomness) if m is not an integer multiple of T, and it is exactly one half if m is an integer multiple of T and the two sequences overlap perfectly. One half instead of one is the result of causality, i.e., $X[n]=0$ for $n<0$.

The PSDs of $X[n]$, $V_{in}[n]$, and $Y[n]$ are now denoted as $\Phi_{XX}(e^{j\omega})$, $\Phi_{VV}(e^{j\omega})$, and $\Phi_{YY}(e^{j\omega})$, respectively. Using the Wiener Khinchin theorem and equation (17), the following is obtained:

$$\Phi_{XX}(e^{j\omega}) = \mathscr{F}\{R_{XX}[m]\} \quad (18)$$

$$= \frac{\pi}{T}\sum_{k=-\infty}^{\infty}\delta\left(\omega - \frac{2\pi k}{T}\right),$$

and subsequently:

$$\Phi_{YY}(e^{j\omega}) = \mathscr{F}\{R_{XX}[m]\cdot R_{VV}[m]\} \quad (19)$$

$$= \frac{1}{2\pi}\int_{-\pi}^{+\pi}\Phi_{XX}(e^{j\omega})\Phi_{VV}(e^{j(\omega-\theta)})d\theta$$

$$= \frac{1}{2T}\sum_{k=-\frac{T}{2}}^{\frac{T}{2}}\Phi_{VV}\left(e^{j\left(\omega-\frac{2\pi k}{T}\right)}\right).$$

Figure 7:
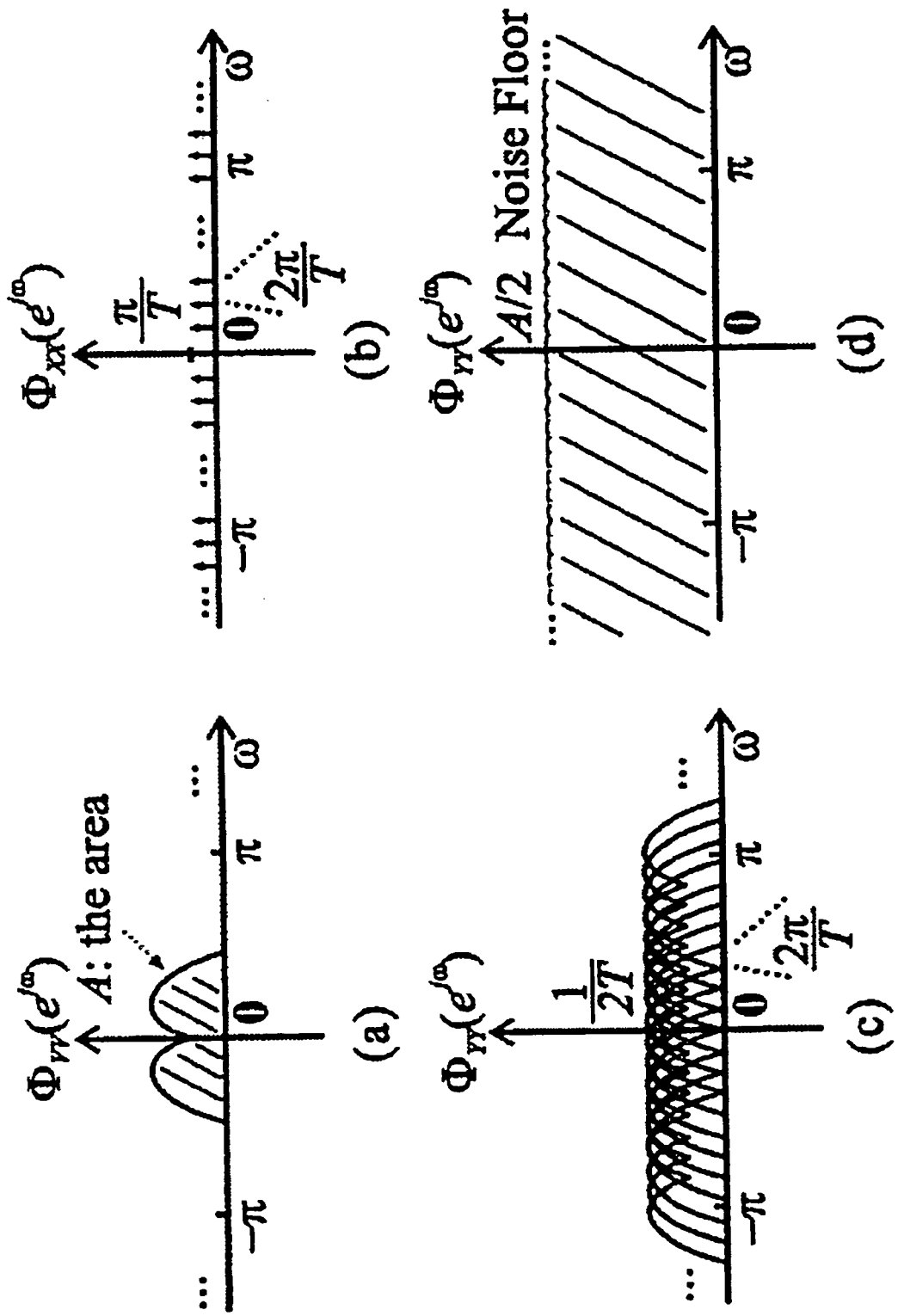
FIG. 7 illustrates PSDs (power spectral densities) of $\Phi_{VV}(e^{j\omega})$, $\Phi_{XX}(e^{j\omega})$ and $\Phi_{YY}(e^{j\omega})$.

The frequency domain illustrations of these results are shown in FIG. 7. $\Phi_{VV}(e^{j\omega})$ and $\Phi_{XX}(e^{j\omega})$ are shown in FIG. 7(a) and FIG. 7(b), respectively. $\Phi_{YY}(e^{j\omega})$ of equation (19) is shown both in FIG. 7(c), which depicts the process of scaled repeating and shifting of $\Phi_{VV}(e^{j\omega})$, and in FIG. 7(d), which depicts the final result of the total summation, which will be performed now.

In any practical correlation-based digital background calibration, T is always large enough so that $2\pi/T$ is much smaller than the input signal bandwidth. Therefore, $\Phi_{YY}(e^{j\omega})$ of equation (19) can be rewritten into:

$$\Phi_{YY}(e^{j\omega}) = \mathscr{F}\{R_{XX}[m]\cdot R_{VV}[m]\} \quad (20)$$

$$= \frac{1}{2\pi}\int_{-\pi}^{+\pi}\Phi_{XX}(e^{j\theta})\Phi_{VV}(e^{j(\omega-\theta)})d\theta$$

$$= \frac{1}{2T}\sum_{k=-\frac{T}{2}}^{\frac{T}{2}}\Phi_{VV}\left(e^{j\left(\omega-\frac{2\pi k}{T}\right)}\right)$$

In equation (20), the fact that $\Phi_{VV}(e^{j\omega})$ has a period of $2\pi$ has been resorted to, in obtaining the second line.

The analysis above leads to three meaningful interpretations of the second term $Y[n]=X[n]V_{in}[n]$ of $\Delta_{in}[n]$ in equation (15), for large enough T:

1) $\Phi_{YY}(e^{j\omega})$ is not a function of frequency, that is, $Y[n]=V_{in}[n]\times[n]$ is a discrete-time white noise. See FIG. 7 (d).

2) $\Phi_{YY}(e^{j\omega})$ is half the input signal energy. Therefore, an input signal with larger energy leads to a higher white noise floor of FIG. 7(d), making it harder to extract $\Delta$ from $\Delta_{in}[n]$ of equation (15). This explains why foreground calibration is much faster than background calibration. In foreground calibration, $V_{in}[n]=0$, and hence the noise floor is zero, so we need much less time for convergence. In contrast, in background calibration, since normal ADC operation is not interrupted and $V_{in}[n]\neq 0$, more calibration cycles are needed to average out large noise $X[n]V_{in}[n]$, resulting in long convergence time.

3) The amplitude of the noise floor $\Phi_{YY}(e^{j\omega})$ has no dependence on T. Therefore, increasing pseudo-random signal period T will not help reduce noise floor.

Figure 8:
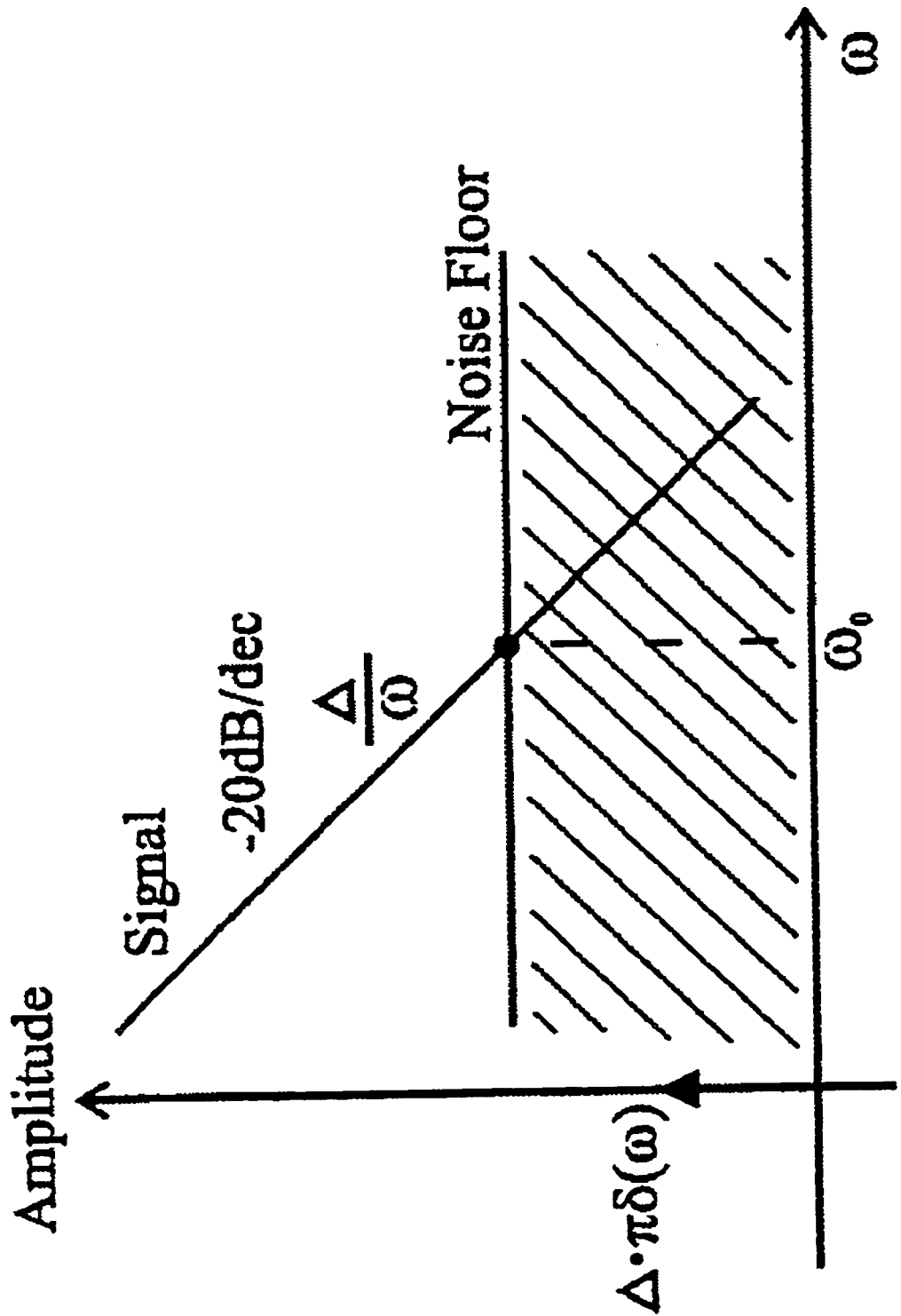
FIG. 8 illustrates a frequency-domain representation (log scale) of $\Delta_{in}[n]$.

Combining the white noise $\sqrt{\Phi_{YY}(e^{j\omega})}$ and signal $\Im\{\Delta\cdot u[n]\}$ of equation (16), the overall frequency domain representation of $\Delta_{in}[n]$ is shown in FIG. 8. The signal amplitude is equal to the noise amplitude at $\omega_0$. Since noise directly affected by $V_{in}[n]$ is rather strong compared to signal, $\omega_0$ is quite small. Therefore, in the vicinity of $\omega_0$, $\omega<<1$ and $\Im\{\Delta\cdot u[n]\}$ of (16) can be modeled as a $-20$ dB/dec line, for $\Delta/(1-e^{j\omega})\cong -\Delta/(j\omega)$.

From the analysis above and FIG. 8, it can be seen that the function of $\Delta$-extraction block 640 of FIG. 6 is essentially to extract $\Delta$ out of the noise floor in frequency domain. In other words, the problem of designing a better $\Delta$-extraction block has just been transformed into a filter design problem.

As mentioned earlier, convergence time is determined by the $\Delta$-extraction block. Therefore, attaining faster convergence within a given calibration accuracy means designing a discrete-time LPF with a bandwidth high enough to settle fast (for convergence time) but low enough to reject the white noise (for accuracy). The correctness of the filter picture was shown in Exhibit 2 of the '739 provisional application, by providing that the widely used iterative method for extraction is equivalent to the 1st order IIR LPF. As noted in paragraph [0001], the '739 provisional application (including all Exhibits thereto) is incorporated herein by reference in its entirety as though fully set forth.

Building upon the filter-design notion described above, the fast convergence solution implemented in some embodiments of the present disclosure can be conceptualized.

Based on the frequency domain representation of $\Delta_{in}[n]$ in FIG. 8, the trade-off that must be faced when deciding the LPF bandwidth can be seen. If the bandwidth is too small, the final convergence will be accurate rejecting more noise, but it will take long for the LPF output to converge. If the bandwidth is too large, convergence will be faster, but more noise filtered in undermines the calibration accuracy. Convergence time trades off with calibration accuracy, when bandwidth is the design parameter. Therefore, in high resolution ADC applications where calibration accuracy requirement is stringent, correlation-based digital background calibrations exhibit a long convergence time.

The fast convergence technique described in the present disclosure is made possible by relaxing the tradeoff between convergence time and convergence accuracy. In one embodiment, this is achieved by incorporating the following two features in the discrete-time IIR LPF. First, a higher-order discrete-time IIR LPF is used. Second, a bandwidth switching scheme is used in the LPF, namely a large bandwidth during transient and a small bandwidth during steady state. "Large bandwidth" means a bandwidth larger than a reference value; "small bandwidth" means a bandwidth smaller than a reference value. It is noted that convergence time is a transient property and convergence accuracy is a steady-state property.

Besides bandwidth, filter order is another design parameter one can make use of in the design of the discrete-time IIR LPF. For faster or more accurate $\Delta$-extraction, a higher-order LPF is advantageous.

First, for the same bandwidth, a higher-order LPF rejects more out-of-band noise, because the increased order corresponds to a steeper frequency response at the falling edge. For example, by increasing the filter order from 1 to 3 while maintaining the same bandwidth, the out-of-band noise energy at the LPF output is reduced by 80%, and the total noise energy at the LPF output is reduced by 40%. In general, total noise energy is equal to the in-band noise energy plus out-of-band noise energy. Since the signal energy is concentrated at low enough frequencies, the signal energy loss due to the increased order is negligible. Overall, for the same bandwidth, while the convergence speed remains the same, a higher order LPF rejects more noise, achieving higher convergence accuracy.

Alternatively, a scenario may be considered where the final target calibration accuracy is given. In other words, the out-of-band noise energy an LPF is to reject is fixed, in this scenario. In such a case, a higher-order LPF can have a higher bandwidth, and hence, will exhibit faster convergence. For example, the bandwidth of 3rd-order LPF can be set approximately twice that of the $1^{st}$-order LPF, therefore increasing convergence speed by a factor of 2.

The advantage of a higher-order IIR LPF is thus shown, for attaining faster convergence or higher accuracy. Too higher an order (>10), however, will not be proportionally effective, because in-band noise dominates in such high-order filters. Considering the efficacy of noise reduction, the best choice of the discrete-time IIR LPF order would be between 3 and 5. As discrete-time filters are used, using filter orders between 3 and 5 incurs only minimum digital circuit cost.

In the above-described embodiments, introducing the filter order as another design parameter has relaxed the tradeoff between convergence speed and calibration accuracy, hence increasing convergence speed for a given accuracy.

Figure 9:
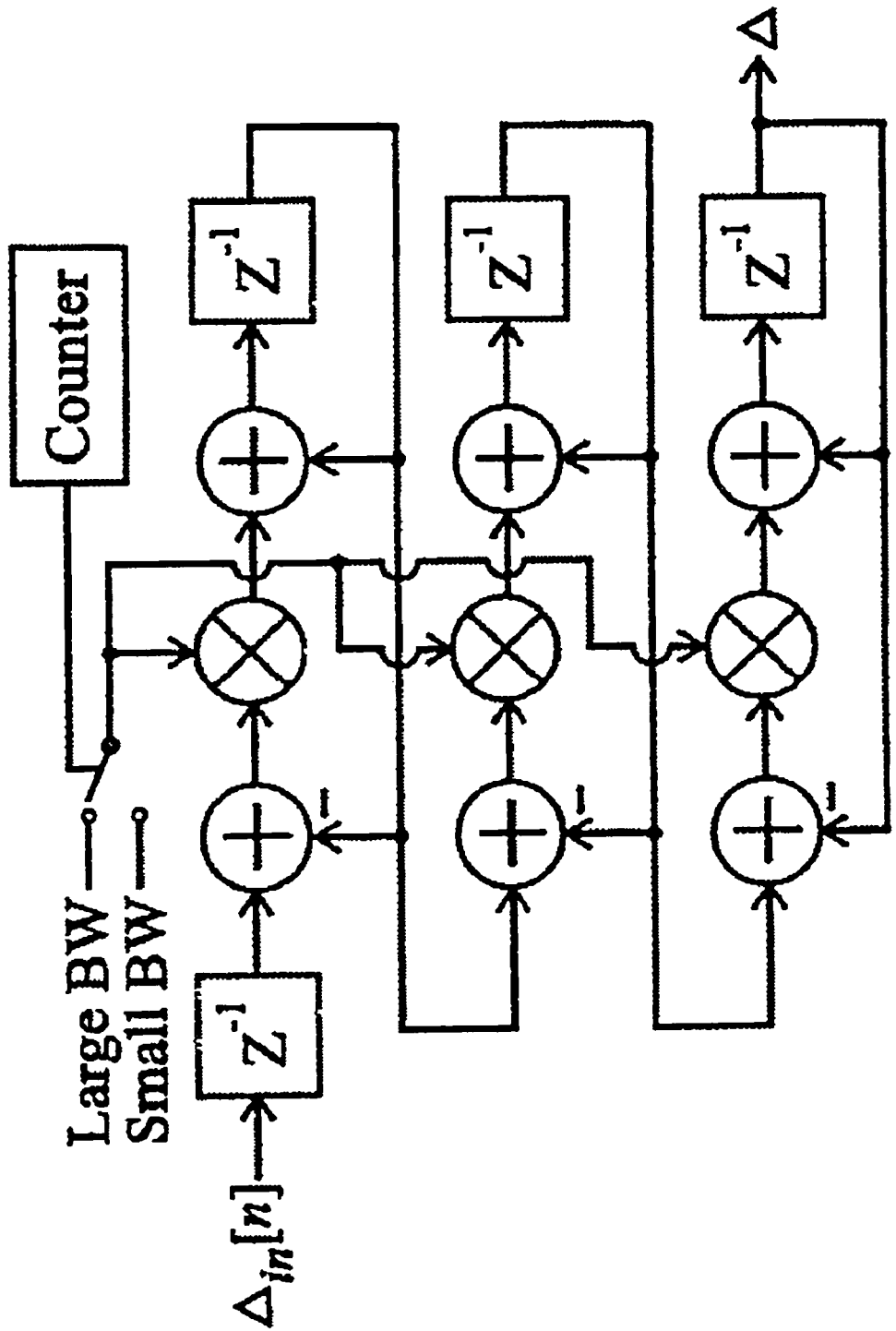
FIG. 9 illustrates a 3rd order discrete-time IIR LPF (infinite impulse response low-pass filter) that incorporates a bandwidth switching scheme, in accordance with one embodiment of the present disclosure.

FIG. 9 illustrates a 3rd order discrete-time IIR LPF that incorporates a bandwidth switching scheme. In the illustrated embodiment, another more direct way of relaxing the tradeoff is implemented, namely: utilization of a larger bandwidth during the calibration start-up (transient) and use of a smaller bandwidth near & during the final convergence (steady-state).

This technique is based on the notion that the convergence speed is what matters during transient, and the convergence accuracy (error) is what matters during steady state. During calibration startup, in order to achieve a faster convergence speed, a large bandwidth is used. During this phase, although more noise is let through because of the larger bandwidth, the convergence accuracy is not a concern during this early stage of the calibration. Only after a calibration mid-point is reached, a smaller bandwidth is used to reduce steady-state convergence errors. By utilizing this adaptive bandwidth scheme, both convergence speed and convergence accuracy may be simultaneously enhanced.

The bandwidth switching described above can be cost-efficiently implemented in discrete-time filters by simply altering multiplication coefficients, as shown in FIG. 9 for a $3^{rd}$-order LPF. The extra circuitry cost is merely simple combinational logic gates and a counter used to determine when to execute the switching.

In sum, in section II of the present disclosure methods and systems have been described for fast convergence or acceleration of correlation-based background calibration. The digital fast-convergence technique described in the present disclosure as a cost-effective way of accelerating correlation-based background calibration was made possible by a change of view on the mismatch extraction process (a central step in any correlation-based digital background calibration) from the time-domain angle to the frequency-domain angle. This allowed the design of the mismatch extraction algorithm to be treated as a filter design problem. Subsequently, designing a higher-order filter incorporating an opportunistic bandwidth switching scheme led to the fast convergence.

Although the above fast-convergence methods and systems were described in the context of capacitor mismatch errors, these methods and systems can be applied to errors caused by any other types of nonidealities, including but not limited to insufficient amplifier gain and input offsets.

It is contemplated that the subject matter described herein may be embodied in many forms. Accordingly, the embodiments described in detail below are illustrative embodiments, and are not to be considered limitations. Other embodiments may be used in addition or instead.

The components, steps, features, objects, benefits and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently.

The phrase "means for" when used in a claim embraces the corresponding structures and materials that have been described and their equivalents. Similarly, the phrase "step for" when used in a claim embraces the corresponding acts that have been described and their equivalents. The absence of these phrases means that the claim is not limited to any of the corresponding structures, materials, or acts or to their equivalents.

Nothing that has been stated or illustrated is intended to cause a dedication of any component, step, feature, object, benefit, advantage, or equivalent to the public, regardless of whether it is recited in the claims.

In short, the scope of protection is limited solely by the claims that now follow. That scope is intended to be as broad as is reasonably consistent with the language that is used in the claims and to encompass all structural and functional equivalents.

What is claimed is:

1. A background calibration method for calibrating a pipelined Analog-to-Digital Converter (ADC), the pipelined ADC having at least a first capacitor $C_1$ and a second capacitor $C_2$, the method comprising:
    measuring a mismatch between $C_1$ and $C_2$ to determine a capacitor mismatch value that represents the mismatch, by passing a precalibration digital output $D_{out}$ of the pipelined ADC through a capacitor mismatch information extraction path in a background correlation loop and performing commutated feedback capacitor switching (CFCS) in the background correlation loop; and
    using the measured capacitor mismatch value to determine an error in $D_{out}$ that is caused by the capacitor mismatch, and calibrating out the error by subtracting the error from $D_{out}$, in a digital calibration path within the background correlation loop.

2. The method of claim 1,
    wherein capacitor mismatch is assumed only in the MSB (most significant bit) stage of the pipelined ADC, and CFCS is performed only during the MSB stage.

3. The method of claim 2, wherein the act of performing commutated feedback capacitor switching in a background correlation loop comprises selecting, during a charge transfer phase of the MSB stage, either $C_1$ or $C_2$ as a feedback capacitor based on a digital decision $d_1$ on the MSB that is determined in a preceding sampling phase.

4. The method of claim 3,
    wherein the act of performing commutated feedback capacitor switching in a background correlation loop comprises selecting between a first CFCS mode and a second CFCS mode, and performing the selected mode;
    wherein the ADC transfer curve for the first CFCS mode is different from the ADC transfer curve for the second CFCS mode; and
    wherein the distance between the two different ADC transfer curves is proportional to Δ.

5. The method of claim 4, wherein the pipelined ADC is a 1 bit-per-stage pipelined ADC;

wherein in the first CFCS mode, $C_1$ is selected as feedback capacitor if $d_1=0$ and $C_2$ is selected as feedback capacitor if $d_1=1$; and
wherein in the second CFCS mode, $C_2$ is selected as feedback capacitor if $d_1=0$ and $C_1$ is selected as a feedback capacitor is $d_1=1$.

6. The method of claim 5,
wherein
wherein the capacitor mismatch value $\Delta$ is given by:
$\Delta \equiv (C_1/C_2)-1$;
wherein when in the first CFCS mode is selected and performed, $C_1$ is selected as feedback capacitor if $d_1=0$ and $C_2$ is selected as feedback capacitor if $d_1=1$, and the digital output $D_{out}$ is given by:

$$D_{out} = \begin{cases} (1-\Delta/2)V_{in} - (\Delta/2)V_{REF} & \text{[for } d_1 = 0]\\ (1+\Delta/2)V_{in} - (\Delta/2)V_{REF} & \text{[for } d_1 = 1] \end{cases}$$
$$= V_{in} + (\Delta/2)(|V_{in}| - V_{REF});$$

and
wherein when in the second CFCS mode is selected and performed, $C_2$ is selected as feedback capacitor if $d_1=0$ and $C_1$ is selected as a feedback capacitor is $d_1=1$, and a residue voltage $V_{RES}$ of the MSB stage is given by:

$$V_{RES} = \begin{cases} (2+\Delta)V_{in} + (1+\Delta)V_{REF} & \text{[for } d_1 = 0]\\ (2-\Delta)V_{in} - (1-\Delta)V_{REF} & \text{[for } d_1 = 1], \end{cases}$$

and the digital output $D_{out}$ is given by:

$$D_{out} = V_{in} - (\Delta/2)(|V_{in}| - V_{REF}).$$

7. The method of claim 6, wherein the act of extracting the capacitor mismatch value $\Delta$ in a background correlation loop comprises:
randomly choosing one mode between the first CFCS mode and the second CFCS mode, with equal probability for each input sample;
creating a data sequence consisting of the resulting ADC outputs, wherein each output is multiplied by 1 if the first CFCS mode was used and by
−1 if the second CFCS mode was used; and
time-averaging the data sequence.

8. The method of claim 4,
wherein the pipelined ADC is a 1.5 bit-per-stage pipelined ADC;
wherein in the first CFCS mode, $C_1$ is selected as feedback capacitor if $d_1=01$ and $C_2$ is selected as feedback capacitor if $d_1=00$ or $d_1=10$, and wherein in the second CFCS mode, $C_2$ is selected as a feedback capacitor if $d_1=01$ and $C_1$ is selected as a feedback capacitor if $d_1=00$ or $d_1=10$.

9. The method of claim 1,
wherein the act of extracting the capacitor mismatch value $\Delta$ comprises: passing a pre-calibration ADC output $D_{out}[n]$ through a capacitor mismatch information extraction path P2 in the background correlation loop;
in the path P2, multiplying $D_{out}[n]$ by a pseudo-random variable $X[n]$, and a function $f(D_{out}[n])$; and
transmitting $X[n] D_{out}[n] f(D_{out}[n])$ through a $\Delta$ extraction block, wherein the $\Delta$ extraction block is a discrete-time infinite impulse response low pass filter.

10. The method of claim 1,
wherein capacitor mismatch is assumed in one or more stages of the pipelined ADC other than the MSB (most significant bit) stage, and CFCS is performed during each of said one or more other stages.

11. The method of claim 1,
wherein the pipelined ADC is an m-bit-per-stage pipelined ADC having $2^m$ capacitors $C_1, C_2, \ldots, C_2{}^m$ in each stage, and wherein the method further comprises:
for each $k=1, 2, 3, \ldots 2^m-1$, extracting a capacitor mismatch value $\Delta_k$ between $C_k$ and $C_{k+1}$ by performing commutated feedback capacitor switching (CFCS) in a background correlation loop; and
using the extracted value $\Delta_k$ to calibrate out errors caused by the capacitor mismatches, for all $k=1, 2, 3, \ldots 2^m-1$, by subtracting the errors from the digital output $D_{out}$ of the pipelined ADC.

12. The method of claim 11, wherein for each k, the act of extracting the capacitor mismatch value $\Delta_k$ comprises:
selecting between a first CFCS mode and a second CFCS mode, wherein in the first CFCS mode, $C_k$ is selected as a feedback capacitor if $d_1$ is even, and $C_{k+1}$ is selected as a feedback capacitor if $d_1$ is odd; and
wherein in the second CFCS mode, $C_{k+1}$ is selected as a feedback capacitor if $d_1$ is odd, and $C_k$ is selected as a feedback capacitor if $d_1$ is even.

13. The method of claim 11, wherein the acts of extracting a capacitor mismatch value $\Delta_k$ between $C_k$ and $C_{k+1}$ and using the extracted value $\Delta_k$ to calibrate out errors comprise, for each input sample and time index n:
selecting k and decide which $\Delta_k$ is to be extracted, using a pseudo-random signal $X_{cap}[n]$ whose values are 1, 2, 3 ..., $(2^m-1)$, with equal probability;
selecting between the first CFCS mode and the second CFCS mode for that k, using another pseudo-random signal $X_{mode}[n]$ whose values are +1 and −1, with equal probability; and
$X_{mode}[n] D_{out}[n] f(D_{out}[n])$ go through the $k^{th}$ LPF; and
extracting $\Delta_k$ from the output of the $k^{th}$ LPF; and
using $\Delta_k$ to digitally calibrate out the error caused by capacitor mismatch between $C_k$ and $C_{k+1}$.

14. A system for background calibrating a pipelined ADC, the pipelined ADC having a sampling capacitor $C_1$ and a feedback capacitor $C_2$, the system comprising:
circuitry configured to measure a value $\Delta$ of a capacitor mismatch between the sampling capacitor $C_1$ and the feedback capacitor $C_2$ by performing commutated feedback capacitor switching during a charge transfer phase of the pipelined ADC, the circuitry further configured to use the measured value of the mismatch to determine an error in a precalibration digital output $D_{out}$ of the pipelined ADC, caused by the capacitor mismatch, and to calibrate the ADC by subtracting the capacitor mismatch error from the digital output $D_{out}$, in a digital calibration path within a background correlation loop in the system.

15. The system of claim 14,
wherein the circuitry further comprises:
a pseudo-random number generator configured to generate a pseudo-random variable $X[n]$, where n is the number of input samples to the ADC;
an analog-to-digital conversion module configured to generate a pre-calibration ADC output Dout[n] from an analog input voltage $V_{in}$ of the pipelined ADC;
a $\Delta$ extraction module configured to process the variable $X[n]$ and the output Dout[n] to extract the value $\Delta$ of the mismatch between $C_1$ and $C_2$, the $\Delta$ extraction module including a discrete-time infinite impulse response low-pass filter (IIR LPF) configured to output a DC average of $X[n]$ Dout[n]; and a digital calibration module configured to receive as input the capacitor mismatch value Δ and the pre-calibration output Dout[n], the digital calibration module further configured to calibrate the output Dout[n] by subtracting therefrom the error caused by the capacitor mismatch value Δ.

16. The system of claim 15, wherein the analog-to-digital conversion module includes a control switch configured to select between a first CFCS mode and a second CFCS mode, based on the value of the pseudo-random variable X[n].

17. The system of claim 15, wherein the analog-to-digital conversion module further includes one or more comparators configured to generate a digital decision for the input voltage $V_{in}$ for one or more stages of the pipelined ADC.

18. A method of increasing convergence speed during a digital background calibration of a pipelined ADC, the method comprising:

using a low pass filter (LPF) of order higher than one, when performing discrete-time low-pass filtering to extract a mismatch value between a first component and a second component of the pipelined ADC; and utilizing a bandwidth switching scheme in which a bandwidth larger than a reference value is used during calibration start-up so as to increase convergence speed, then the bandwidth is decreased after calibration mid-point so as to increase convergence accuracy during steady state.

19. The method of claim 18, wherein the first component is a sampling capacitor and the second component is a feedback capacitor.

20. The method of claim 18, further comprising the act of utilizing a bandwidth switching scheme in which a bandwidth larger than a reference value is used during calibration start-up so as to increase convergence speed, then the bandwidth is decreased after calibration mid-point so as to increase convergence accuracy during steady state.

* * * * *